US008698485B2

(12) United States Patent
Hozoi et al.

(10) Patent No.: US 8,698,485 B2
(45) Date of Patent: Apr. 15, 2014

(54) CURRENT SENSOR OPERATING IN ACCORDANCE WITH THE PRINCIPLE OF COMPENSATION

(75) Inventors: Adrian Hozoi, Mannheim (DE); Rolf Disselnkötter, Mauer (DE)

(73) Assignee: ABB AG, Mannheim (DE)

( * ) Notice: Subject to any disclaimer, the term of this patent is extended or adjusted under 35 U.S.C. 154(b) by 172 days.

(21) Appl. No.: 13/452,178

(22) Filed: Apr. 20, 2012

(65) Prior Publication Data

US 2012/0268108 A1 Oct. 25, 2012

(30) Foreign Application Priority Data

Apr. 21, 2011 (EP) ..................................... 11003400

(51) Int. Cl.
*G01R 21/06* (2006.01)
(52) U.S. Cl.
USPC .................... 324/117 H; 324/117 R; 324/127
(58) Field of Classification Search
USPC ................... 324/117 R, 117 H, 127; 323/356
See application file for complete search history.

(56) References Cited

U.S. PATENT DOCUMENTS

| 6,218,825 B1 * | 4/2001 | Lenhard .................... 324/117 R |
| 6,445,171 B2 * | 9/2002 | Sandquist et al. ........ 324/117 R |
| 6,713,999 B1 | 3/2004 | Lenhard et al. |

FOREIGN PATENT DOCUMENTS

DE            196 42 472 A1     4/1998

* cited by examiner

*Primary Examiner* — Jay Patidar
(74) *Attorney, Agent, or Firm* — Buchanan Ingersoll & Rooney PC (57) ABSTRACT

An exemplary current sensor operating in accordance with the principle of compensation includes a primary winding creating a magnetic field based on a current to be measured, a secondary winding generating a magnetic field compensating the primary winding based on a compensation current. The current sensor also includes a magnetic core, a terminating resistor connected in series to the secondary winding, and sensor means. A booster circuit is connected downstream of the sensor means and feeds the compensation current to the secondary winding via the terminating resistor. The booster circuit includes a switched mode amplifier with a pulse width and density modulator that operates based on pulse width and density modulation, turning the compensation current into a pulse width and density modulated current. The switched mode amplifier having a switching frequency that is high at when the compensation current is small and low when the compensation current is high.

20 Claims, 8 Drawing Sheets

Fig. 8

CURRENT SENSOR OPERATING IN ACCORDANCE WITH THE PRINCIPLE OF COMPENSATION

RELATED APPLICATION(S)

This application claims priority under 35 U.S.C. §119 to European Patent Application No. 11003400.6 filed in Europe on Apr. 21, 2011, the entire content of which is hereby incorporated by reference in its entirety.

FIELD

The disclosure relates to a current sensor operating in accordance with the principle of compensation, the sensor including a primary coil winding through which the current to be measured flows and creates a magnetic field.

BACKGROUND INFORMATION

Known current sensors operating in accordance with the principle of compensation are often also called closed loop current sensors. Closed loop current sensors are based on a magnetic circuit, called core, of a highly permeable material which encloses a primary winding with the current that is to be measured. A flux sensor element located in the magnetic circuit, e.g. in an air gap, will detect any magnetic flux induced in this circuit and will generate a proportional signal. This signal is amplified by some electronic power stage, called booster circuit, which will generate a current through a secondary winding. This current is opposed to the primary current, establishing a negative feedback, and it will compensate the effect on the magnetic circuit, apart from a small magnetic induction which is specified as the actuating variable for the operation of the feedback loop. This residual induction corresponds to a current error of the whole sensor and needs to be kept small. This can be achieved by designing the amplifier for a very high gain, in terms of secondary current per magnetic induction of the core.

In many known implementations, closed loop current sensors are equipped with linear amplifiers that continuously produce high conduction losses in their transistors or operational amplifiers, for example in the range of medium amplitudes. These semiconductor losses will contribute to the total losses and the supply power demand of the sensor. Moreover, they may give rise to local heating in the sensor, leading to either reduced reliability or increased design effort in terms of cooling means and component and sensor size and cost.

The prior arrow art show a manner of reducing conduction losses in the booster circuit by using a switched mode amplifier with a pulse width modulation scheme instead of a linear amplifier. By continuously switching between full conduction and insulation, these types of devices significantly reduce the conduction losses, even though at the expense of some additional switching losses. Total losses will be usually still much lower as compared to linear amplifiers. A switched mode amplifier will generate a pulsed output voltage whose average will correspond to the output of a corresponding linear amplifier. A continuous output can be restored by means of appropriate filtering.

A closed loop current sensor with a switched mode amplifier is described in DEOS196 42 472, where the sensor uses a switchable booster for decreasing the power specification for the compensation current, and for reducing the losses at an operation with excessive supply voltage, and which is controlled by a pulse width modulated gating signal, which possesses a duty cycle depending on the measured value.

U.S. Pat. No. 6,713,999 B1 shows a current sensor which is provided with low pass filters for stabilizing the pulse width modulated compensation signal, where the current sensor is also provided with an additional RC element, and furthermore, a limiting means including (e.g., consisting of) Zener diodes and an ohmic resistance is provided for suppressing fast current transients.

The pulse width modulation scheme provided in prior art systems uses a constant switching frequency, i.e. it is featuring constant switching losses, while the conduction losses are proportional to the secondary current. This leads to considerable semiconductor losses at high current levels and results in some design limitations such as size and cost of the electronic components. Another effect coming with the pulse width modulation scheme is related to a ripple caused by the constant switching frequency. The absolute value of the ripple is almost independent of the current value, meaning that the relative ripple value at small currents may become quite high. Elaborated filters should then be specified to reduce the ripple.

SUMMARY

An exemplary current sensor is disclosed, comprising: a primary coil, through which current to be measured flows, creating a first magnetic field; a secondary coil, through which a compensation current flows, generating a magnetic field compensating the first magnetic field of the primary coil; a gapped magnetic core, magnetically coupled to the two primary and secondary coils and concentrating the resulting magnetic field in its air gap; a terminating resistor connected in series with the secondary coil; sensor means located in the air gap and exposed to the resulting magnetic field of the primary and secondary coils; and a booster circuit connected downstream of the sensor means and feeds the compensation current to the secondary coil via the terminating resistor, wherein the booster circuit includes a switched mode amplifier with a pulse width and density modulator that generates a pulse width and density modulated voltage signal which drives the compensation current through the secondary coil winding, and wherein the switching frequency of the modulator is a function of the compensation current such that the switching frequency is high at small currents and low at high currents.

A current sensor, comprising: a primary coil generating a first magnetic field based on a first current; a secondary coil generating a second magnetic field based on a second current; a magnetic core having an air gap and magnetically coupled to the primary and secondary coils; a sensor located in an air gap of the magnetic core; and a booster circuit connected downstream of the sensor and feeding the second current to the secondary coil, wherein the booster circuit includes a switched mode amplifier with a pulse width and density modulator that generates a pulse width and density modulated voltage signal which drives the second current through the secondary coil winding, and wherein the switching frequency of the modulator is a function of the second current.

BRIEF DESCRIPTION OF THE DRAWINGS

The foregoing, and other features and advantages of the present disclosure, will become more apparent in the light of the description and the accompanying drawings, where.

DETAILED DESCRIPTION

Exemplary embodiments of the present disclosure reduce semiconductor losses at high currents, and relative ripple value at small currents.

According to an exemplary embodiment disclosed herein a current sensor operating in accordance with the principle of compensation, has a booster circuit which includes a switched mode amplifier with a pulse width and density modulator that generates a pulse width and density modulated voltage signal, which drives the compensation current through the secondary winding after an appropriate filtering. The switching frequency of such modulator is a function of the compensation current in the sense that the switching frequency is high at small currents and low at high currents.

According to another exemplary embodiment, the switching frequency with pulse width and density modulation is highest at small output current and lowest at large currents. The switching losses are therefore lowest at large current when the conduction losses are maximum. The switching losses are highest at small current when the conduction losses are minimum. The pulse width and density modulation scheme results thus in an almost constant power dissipation profile versus the output current with low maximum losses. This allows for relaxed thermal design and use of low cost components.

In addition, the ripple of a current sensor according to the present has a booster circuit which includes a switched mode amplifier that operates based on pulse width and density modulation, decreases with increasing switching frequency, meaning that the ripple of the pulse width and density modulation is proportional to the output current. The relative ripple is thus optimized over the full output current range, allowing for simple and low cost filtering.

According to an exemplary embodiment disclosed herein, the pulse width and density modulator includes a differential amplifier circuit, whose non-inverting input receives the analog current signal, and whose output is connected to the input of a SchmittTrigger circuit, whereby the output of said SchmittTrigger circuit and the inverting input of the differential amplifier are connected by a feedback loop with an ohmic resistor, and the output and the inverting input of the differential amplifier are connected by a feedback loop with a capacitor. One can see that this arrangement thus includes an integrating circuit, in short an integrator, whereby the integrator is formed by the differential amplifier circuit with the capacitor connecting the output and the inverting input of said differential amplifier and with the resistor at the inverting input of said differential amplifier.

In an exemplary embodiment of the present disclosure, the pulse width and density modulator includes a differential amplifier circuit, whose non-inverting input receives the analog current signal, and whose output is connected to an arrangement with two inverting buffer amplifiers, whereby the output and the inverting input of the differential amplifier are connected by a feedback loop with a capacitor, and whereby one of the outputs of said arrangement with two inverting buffer amplifiers and the inverting input of the differential amplifier are connected to form a negative feedback loop with an ohmic resistor. As above, one can see that this arrangement thus includes an integrating circuit, in short an integrator, whereby the integrator is formed by the differential amplifier circuit with the capacitor connecting the output and the inverting input of said differential amplifier and with the resistor at the inverting input of said differential amplifier.

According to an exemplary embodiment, the booster circuit includes a preamplifier, followed by the pulse width and density modulator, followed by a power stage with a FET-halfbridge.

According to another exemplary embodiment of the present disclosure, the power stage includes a half-bridge gate driver and an output filter, followed by two voltage clamping protection diodes. The FET-halfbridge is built from two n-type MOSFETs.

In another exemplary embodiment, the sensor means is a Hall-sensor.

According to another exemplary embodiment, the sensor means is a magneto resistive-sensor.

According to another exemplary embodiment of the present disclosure, the sensor means is a Hall integrated circuit that includes means for temperature compensation. The Hall integrated circuit according to the disclosure can in addition be designed for high sensitivity and programmable offset and offset compensation.

In yet another exemplary embodiment, the bandwidth of the sensor means is limited by a filter in order to have a better control of the transition frequency from active to passive sensor operation mode.

Exemplary current sensors of the present disclosure reduce maximum losses in the electronic components by a more even distribution on the dynamic range. A larger rise time of the switches becomes thus possible. Also, due to the reduced losses, power transistors with reduced size and cost can be applied, as can a smaller size of the electronic components and board be achieved.

No special means should be specified for heat dissipation, for example no molding process and heat spreader plate for cooling is necessary, as is often the case with prior art solutions.

The exemplary embodiments disclosed herein provide a compensation current having a lower ripple, for example at a small and/or medium output current. This will allow reduced size and cost of filter components.

The pulse width and density modulation specify a moderate variation of the switching frequency with respect to a pure pulse density modulation.

An exemplary booster circuit having a switched mode amplifier with a pulse width and density modulator is expected to be easier to implement due to more tolerant specifications on the drivers, MOSFETs, cooling, and output filters than with pure pulse width modulation or pure pulse density modulation alternatives known in other prior art applications. This allows for a larger choice of components and lower cost for the total solution. Moreover, the low rise times that come with the design of the booster circuit according to the present disclosure allow to simplify the design of the printed circuit boards and help to reduce electromagnetic emissions.

Elements with the same function and mode of operation are provided in the FIGS. 1 to 8 with the same references.

Figure 1:
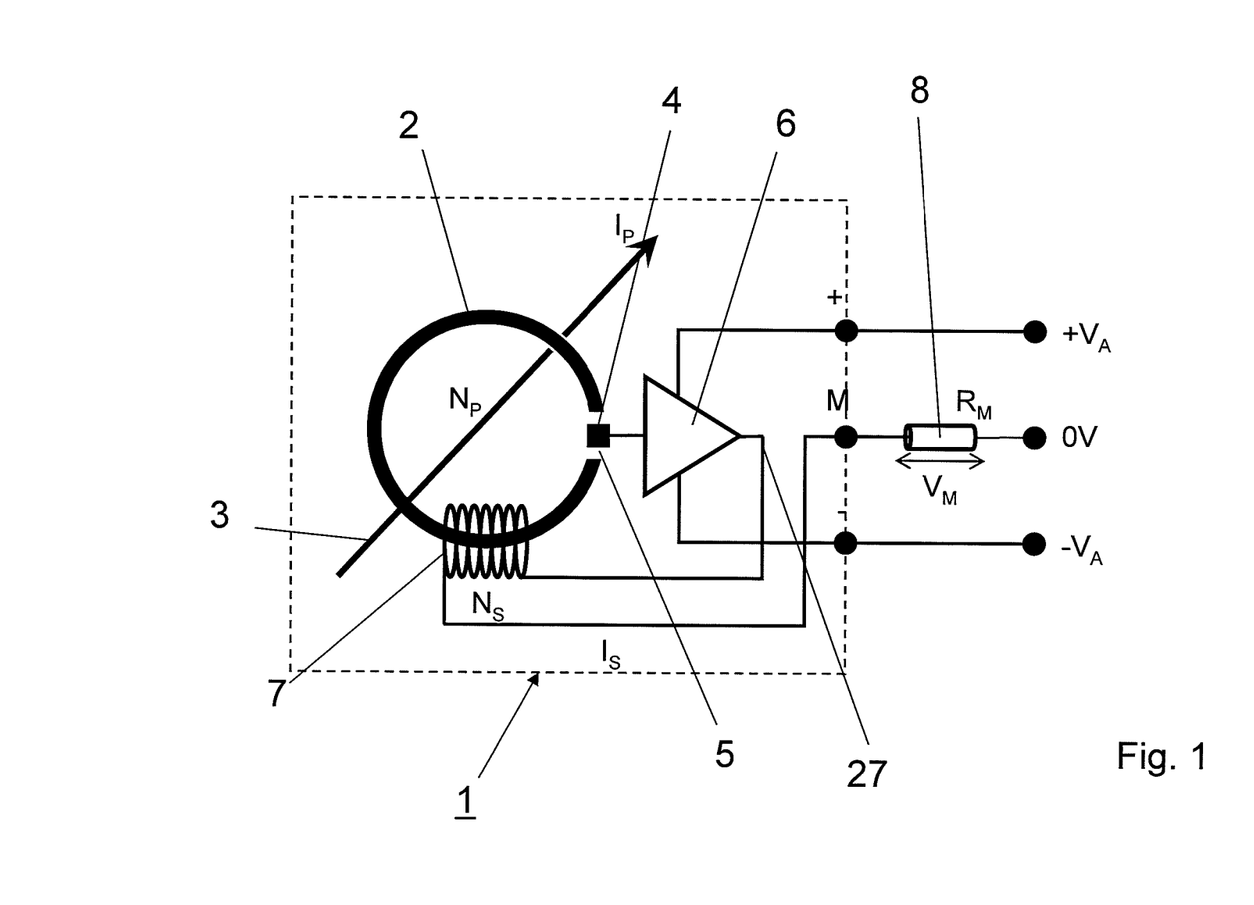
FIG. 1 shows schematic of a closed loop current sensor in accordance with an exemplary embodiment.

FIG. 1 shows schematic of a closed loop current sensor in accordance with an exemplary embodiment. The sensor is based on a magnetic circuit including a magnetic core 2 of a highly permeable material. The magnetic core 2 encloses a primary coil 3 with a number of primary windings NP with the current IP that is to be measured. In the arrangement shown in FIG. 1 the primary coil 3 includes (e.g., consists of) only one winding. A flux sensor element 4 located in the air gap 5 of the magnetic core 2 can detect any magnetic flux induced in the magnetic circuit and will generate a proportional signal.

In the active operation mode of the closed loop sensor, that is at low current frequencies, this signal of the flux sensor element is amplified by an electronic power stage as part of a booster circuit 6.

At high current frequencies, the secondary current can be generated in a passive way, i.e. by the voltage induced in the secondary winding. The high frequency mode is thus called the passive operation mode. The bandwidth of the active operation mode is generally limited by a filter. In the passive operation mode and in a transitional mode, said transitional mode lying between the active and the passive operation mode, the output signal of the Hall sensor is no longer proportional to the primary current, but it is phase shifted.

The booster circuit 6 generates at its output 27 a secondary current IS which flows through a secondary coil 7 with a number of secondary windings NS.

The secondary current is opposed to the primary current, creating a negative feedback. It will compensate the effect of the primary current on the magnetic circuit, apart from a small magnetic induction which is specified as the actuating variable for the operation of the feedback loop. This residual induction corresponds to a current error of the whole sensor arrangement 1 and should be kept small. This result can be achieved by designing the amplifier for a very high gain.

The booster circuit 6 is supplied by a power supply +VA and −VA. The magnitude of the secondary current IS is measured with a terminating resistor 8, also called a measuring resistor RM, connected in series to the secondary winding NS, and further connected to ground potential. The voltage drop VM across the measuring resistor RM is an indication for the secondary current IS and thus gives the measurement value for the primary current IP.

The booster circuit 6 includes a switched mode amplifier which operates with a pulse width and density modulator that operates based on pulse width and density modulation, that generates a pulse width and density modulated voltage signal, which drives the compensation current through the secondary winding after an appropriate filtering, with a switching frequency that is a function of the compensation current in the sense that the switching frequency is high at small currents and low at high currents.

Figure 2:
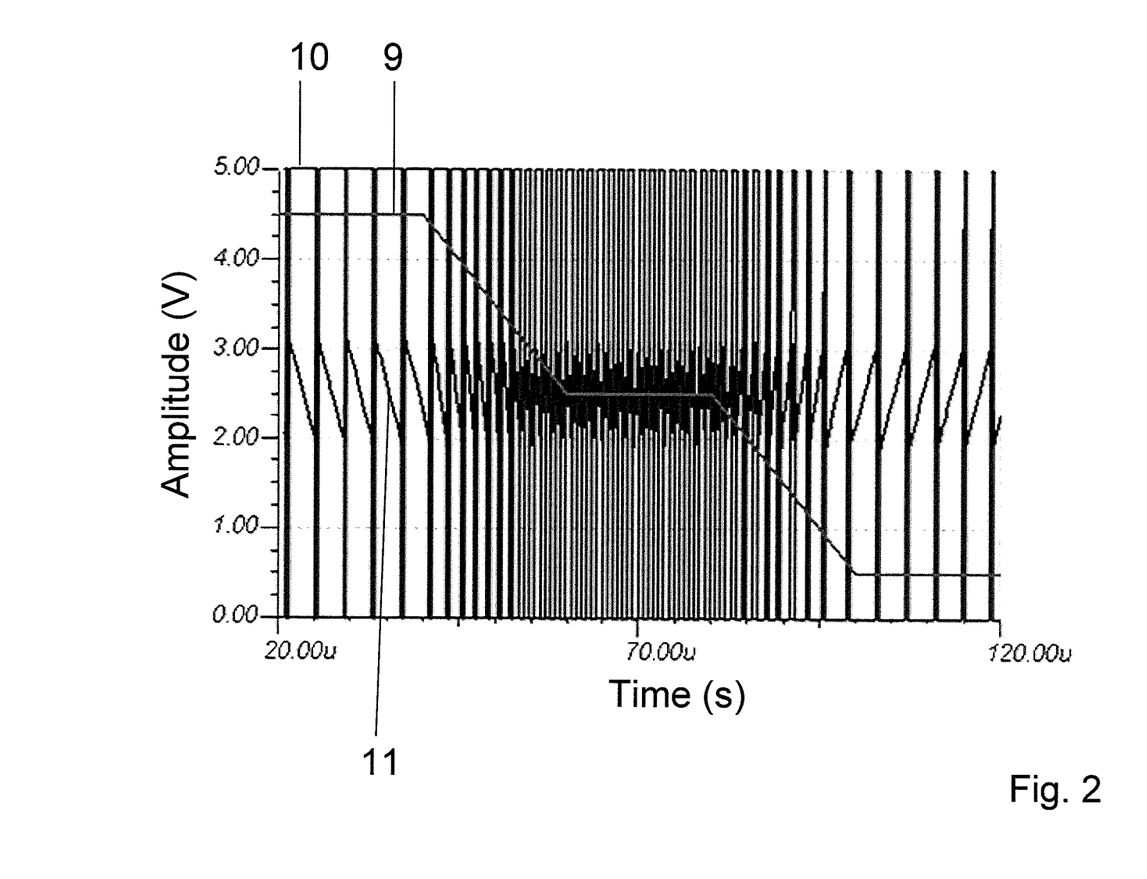
FIG. 2 shows in a graph the relation between the input and the output signal of the pulse width and density modulator in accordance with an exemplary embodiment.

FIG. 2 shows in a graph the relation between the input and the output signal of the pulse width and density modulator in accordance with an exemplary embodiment. The abszissa in the diagram of FIG. 2 gives the time in arbitrary time units, for example seconds. The ordinate in the diagram of FIG. 2 gives voltage amplitude in Volts. Signal curve 10 is the output signal of the modulator. Signal curve 9 is the input signal to the modulator. In the active operation mode this is proportional to the primary current. Signal curve 11 is an internal modulator signal, a triangular wave signal at the output 15 of the differential amplifier.

As shown in FIG. 2, a voltage vs. time diagram of an exemplary course of the input signal 9, indicated as voltage VM, is provided. In the graph of FIG. 2, 2.5 V is an exemplary reference voltage which corresponds to zero current. Thus, in FIG. 2, in the time between approximately 20 u and 40 u, for example, the current has a constant positive value, declining to zero current in the time between 40 u and 60 u, remaining zero in the time between 60 u and 80 u, and decreasing to a negative value in the time between 80 u and 100 u, remaining on a constant negative value from 100 u to 120 u. These values are an exemplary representation of the results that can be achieved with the exemplary embodiments disclosed herein.

The exemplary curve 10 shows the output signal of the modulator. The on-off ratio (duty cycle) of the signal defines the average output voltage and with this the amplitude of the secondary current, where a high on-off ratio results in a high secondary current, and a smaller on-off ratio in a low current. The switching frequency of the switched mode amplifier may not be constant, but depends on the current. The switching frequency is highest at small currents, and lowest at high currents, be it positive or negative.

The switching losses are therefore lowest at large currents when the conduction losses are maximum. On the other hand, the switching losses are highest at small currents when the conduction losses are minimum. The pulse width density modulation scheme shown in FIG. 2 results thus in an almost constant power dissipation profile versus the output current with low maximum losses. This allows for relaxed thermal design and use of low cost components. In addition, the ripple of such a switched mode amplifier decreases with increasing switching frequency, meaning that the ripple is proportional to the output current. The relative ripple is thus optimized over the full output current range, allowing for simple and low cost filtering.

Figure 3:
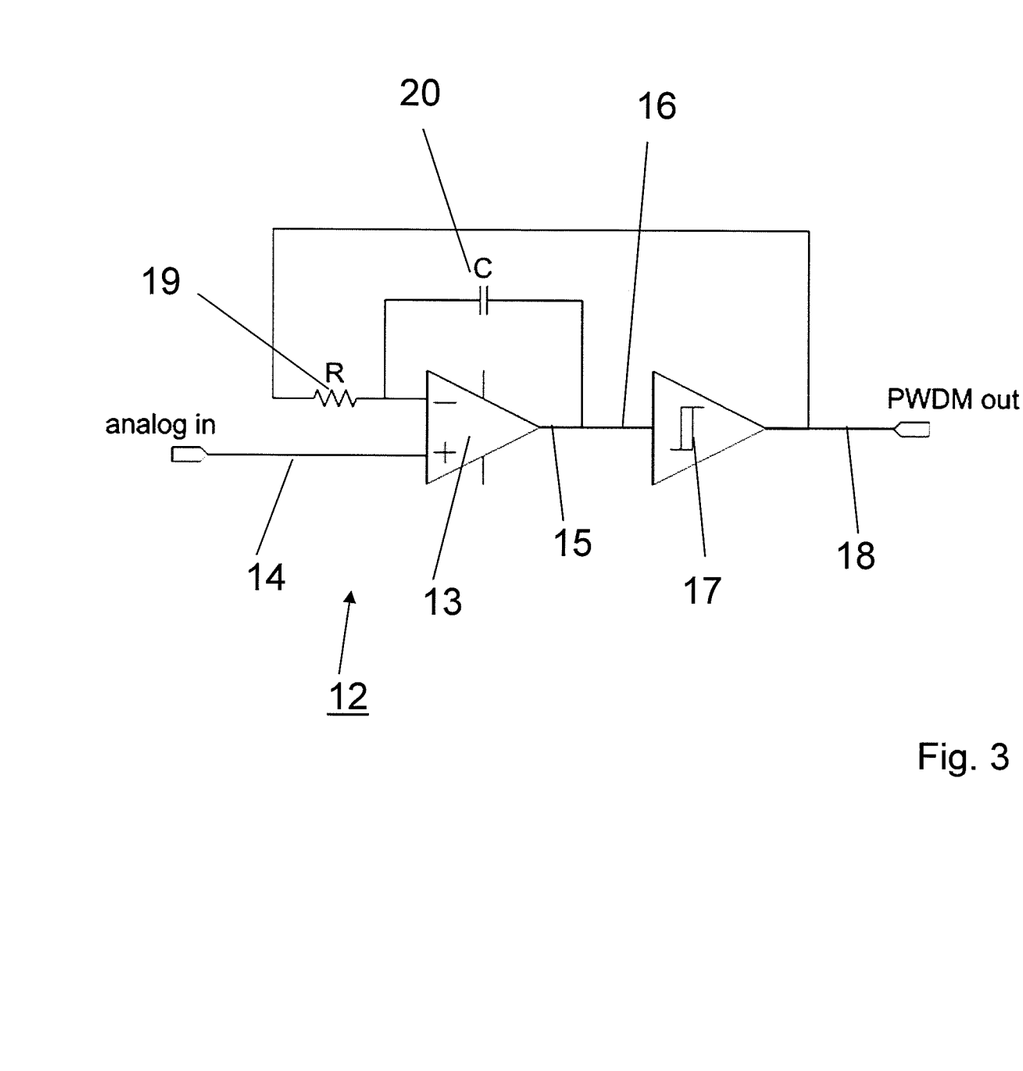
FIG. 3 shows a first pulse width and density modulator with operational amplifier and SchmittTrigger in accordance with an exemplary embodiment.

FIG. 3 shows a first pulse width and density modulator with operational amplifier and SchmittTrigger in accordance with an exemplary embodiment. FIG. 3 illustrates a schematic implementation of an exemplary modulator 12 used in a switched mode amplifier with a pulse width density modulation scheme. The modulator 12 includes a differential amplifier circuit 13, whose noninverting input receives the analog current signal 14, and whose output 15 is connected to the input 16 of a SchmittTrigger circuit 17, whereby the output 18 of said SchmittTrigger circuit 17 and the inverting input of the differential amplifier 13 are connected by a feedback loop with an ohmic resistor 19, and the output 15 and the inverting input of the differential amplifier 13 are connected by a feedback loop with a capacitor 20. One can see that this arrangement thus includes an integrating circuit, in short an integrator, whereby the integrator is formed by the differential amplifier circuit with the capacitor connecting the output and the inverting input of said differential amplifier and with the resistor at the inverting input of said differential amplifier.

The modulator 12 as shown in FIG. 3 turns an analog signal at its input of FIG. 14 into a pulse width and density modulated signal at the output 18, as shown in curve 10. The analog signal is a voltage signal which proportional to the output signal of the flux sensor element 4, and thus in the pure active operation mode, i.e. at low frequencies, it is also indirectly proportional to the primary current.

Figure 4:
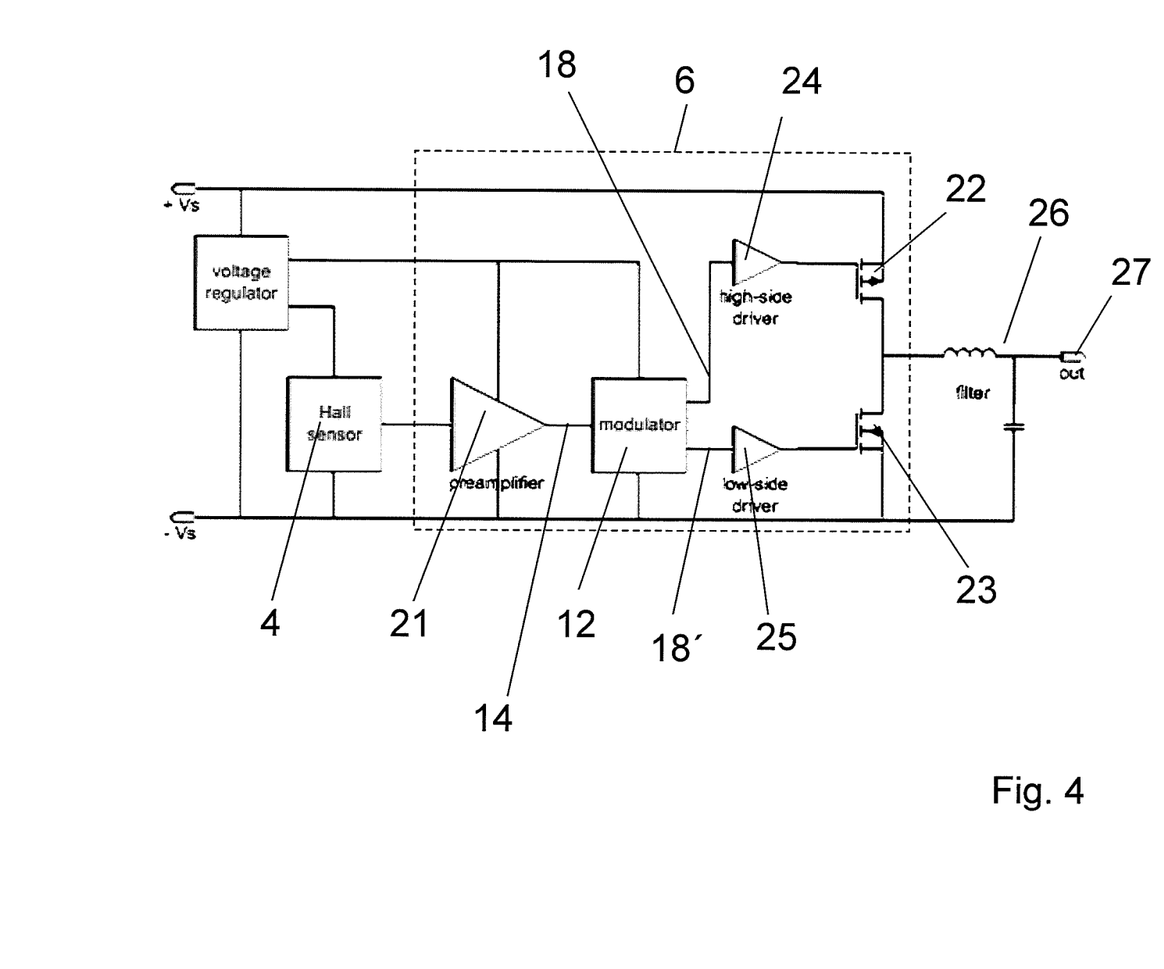
FIG. 4 shows a block diagram of a booster circuit in the first pulse width and density modulator in accordance with an exemplary embodiment.

FIG. 4 shows a block diagram of a booster circuit in the first pulse width and density modulator in accordance with an exemplary embodiment. The booster circuit 6 includes a preamplifier 21, followed by the pulse width and density modulator 12, followed by a power stage with a FET half-bridge. The modulator 12 output signals (18 and 18') are fed to two gate drives (24, 25), which could be also combined in a single unit, and which control a pair of high-power MOSFETs 22, 23. In the case that the modulator generates only one output signal, like in FIG. 3 and in FIG. 6, the gate drive unit(s) need(s) to generate the two MOSFET drive signals from this one signal. In order to achieve good matching and switching performance, the half bridge can be built from two n-type MOSFETs. As an alternative, the principle can also be used with a full bridge instead of a half bridge of power switches.

Downstream of the MOSFET halfbridge 22, 23 there is a low pass output filter 26, here with an RC arrangement, which removes the high frequency switching components of the pulse width and density modulated signal. The filtered signal is then fed to the secondary coil 7, see FIG. 1, where it generates the secondary current.

Figure 5:
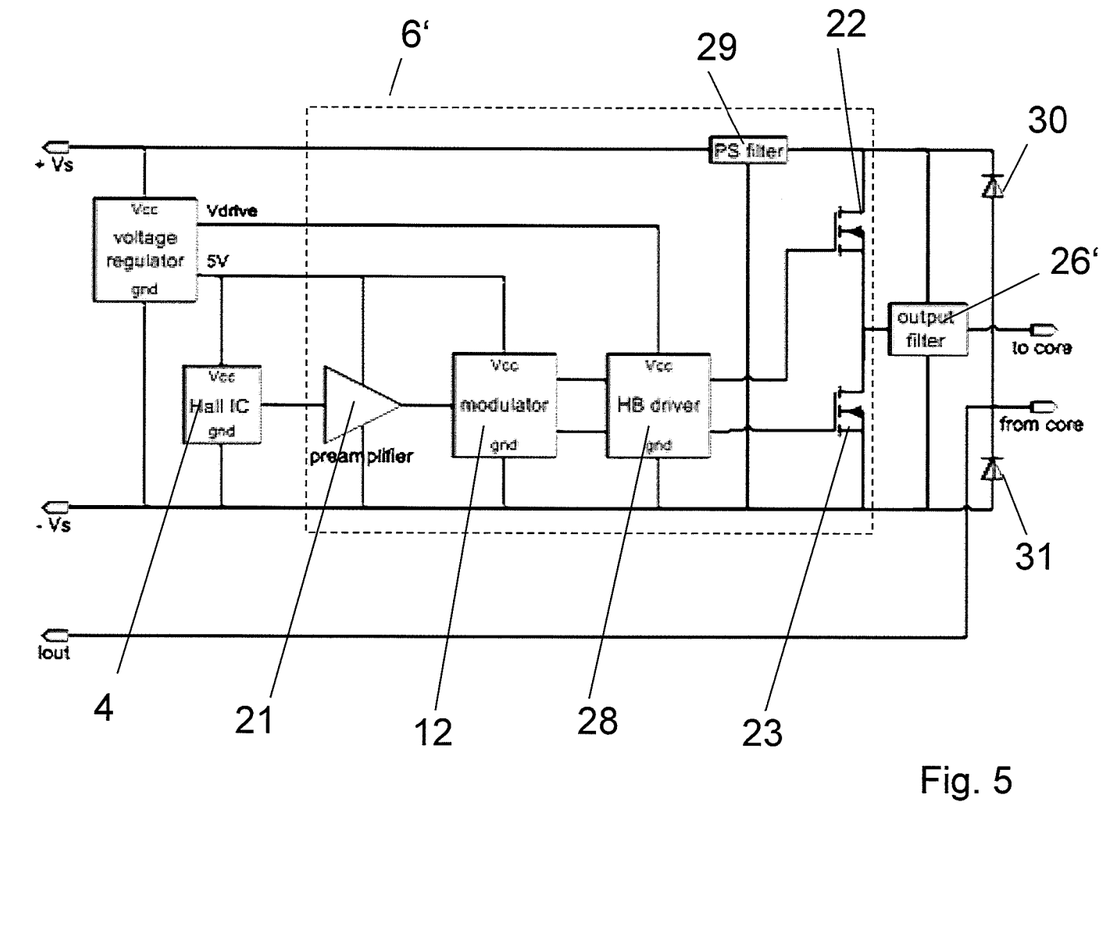
FIG. 5 shows a block diagram of a booster circuit in a second pulse width and density modulator in accordance with an exemplary embodiment.

FIG. 5 shows a block diagram of a booster circuit in a second pulse width and density modulator in accordance with an exemplary embodiment. As shown in FIG. 5, the modulator 12 is followed downstream by a halfbridge gate driver 28, driving the two high power MOSFETs 22, 23. A power supply filter 29 is foreseen in the power supply path in order to avoid the injection of distortions into the supply system. Downstream of the MOSFET halfbridge there is an output filter 26', followed by two clamping diodes 30, 31, which protect from the generation of over voltages in the passive operation mode. The hall sensor 4 can be replaced with a Hall IC that includes means for temperature compensation, offset cancellation, gain adjustment.

Figure 6:
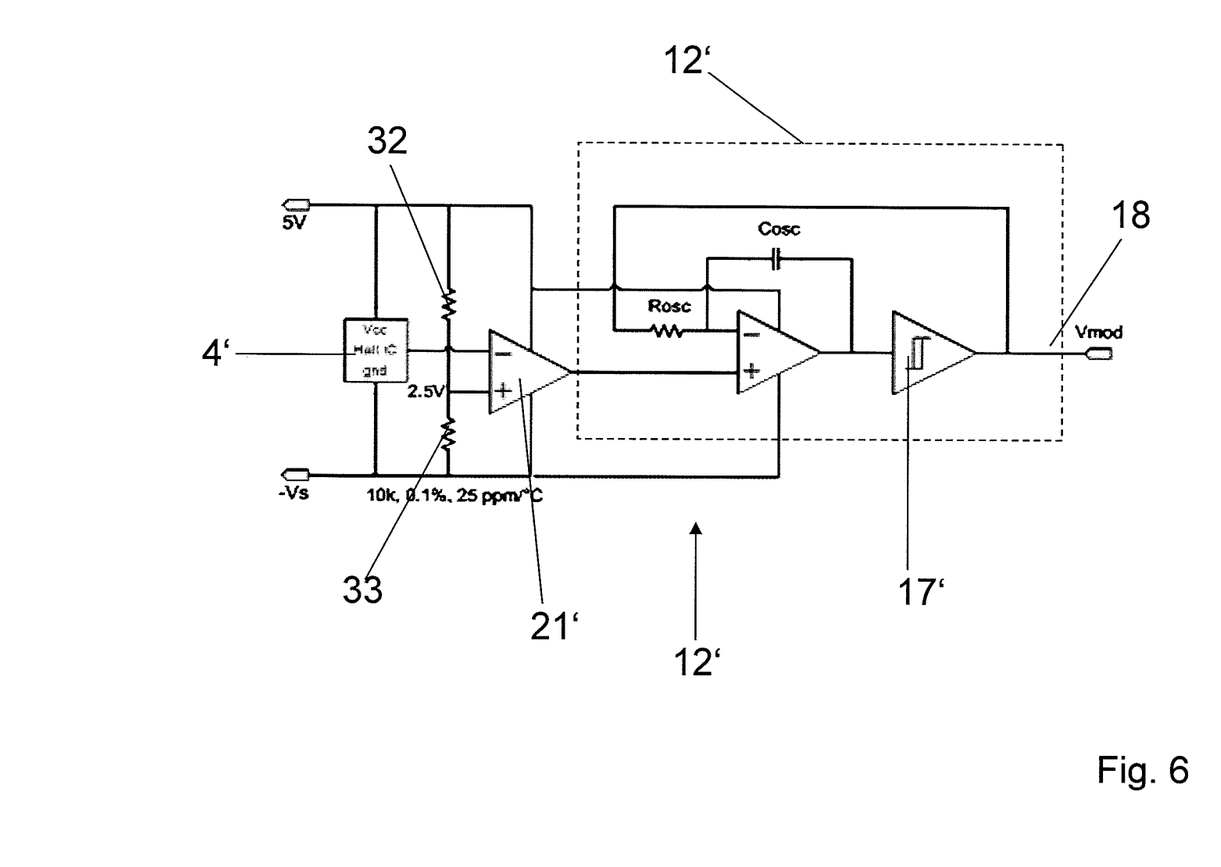
FIG. 6 shows a pulse width and density modulator circuit with a preamplifier a single stage modulator, and a single output in accordance with an exemplary embodiment.

FIG. 6 shows a pulse width and density modulator circuit with a preamplifier a single stage modulator, and a single output in accordance with an exemplary embodiment. The modulator 12' is designed in principle like the one shown in FIG. 3, as a single stage modulator with a single pulse width and density modulated output 18, implemented with a Schmitt Trigger 17'. A single stage preamplifier 21' is installed downstream of the Hall IC 4' and upstream of the modulator 12', using a resistance bridge with two precision resistors 32, 33 as a voltage reference at the input side.

Figure 7:
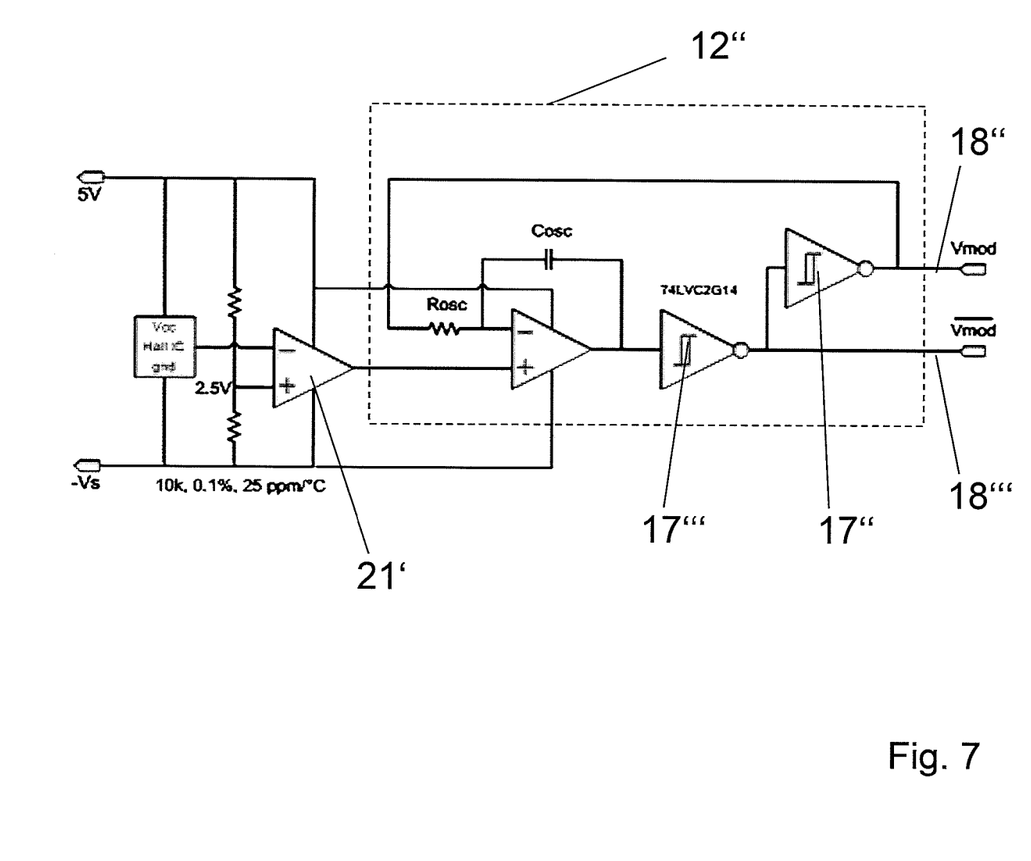
FIG. 7 shows a pulse width and density modulator circuit with a preamplifier, with a two stage modulator and complementary outputs in accordance with an exemplary embodiment.

FIG. 7 shows a pulse width and density modulator circuit with a preamplifier, with a two stage modulator and complementary outputs in accordance with an exemplary embodiment. The modulator 12" shown in FIG. 7 differs from the one shown in FIG. 6 by the fact that it has complementary pulse width and density modulated outputs 18", 18''', which are implemented with two Schmitt Triggers 17", 17''' and which can both be used as inputs for the gate drive unit(s) shown in FIG. 4 and FIG. 5, for example.

Figure 8:
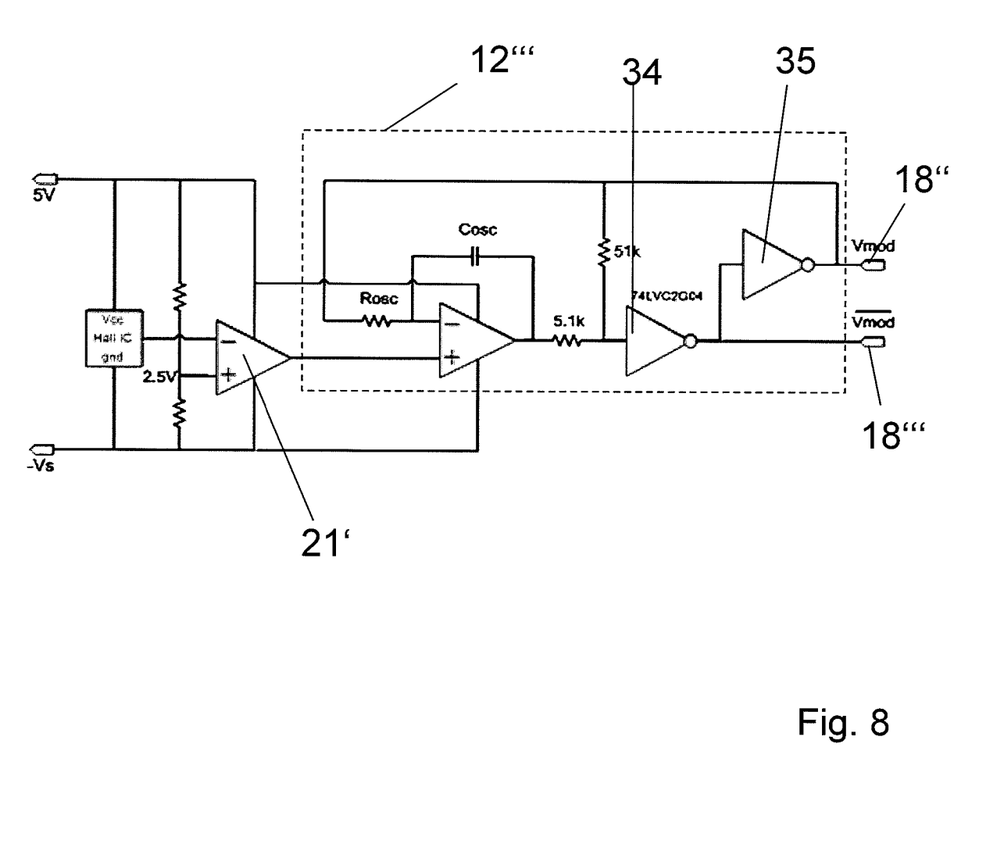
FIG. 8 shows a pulse width and density modulator circuit with preamplifier, with a two stage modulator and complementary outputs, where the modulator has two inverting buffer amplifiers instead of Schmitt-triggers in accordance with an exemplary embodiment.

FIG. 8 shows a pulse width and density modulator circuit with preamplifier, with a two stage modulator and complementary outputs, where the modulator has two inverting buffer amplifiers instead of Schmitt-triggers in accordance with an exemplary embodiment. The modulator 12''' shown in FIG. 8 differs from the one shown in FIG. 7 by the fact that it has complementary pulse width and density modulated outputs 18", 18''', which are implemented with two inverting buffer amplifiers 34, 35.

It shall be mentioned that the type of switched mode amplifier used in the current sensor arrangement according to the exemplary embodiments can also be called a class D amplifier.

In addition to the exemplary embodiments described in the context of the Figures shown, the described inventive principle can be combined with one or several of the following exemplary features.

The shape of the magnetic core 2 may be circular, rectangular, oval or elliptic.

The core material is in exemplary embodiments selected to feature a high magnetic saturation, a low coercivity and a gradual transition into saturation.

The magnetic core 2 of the sensor can have a partial air gap, with a high cut depth, in combination with a thin low offset flux sensor and a high overall gain. The partial air gap can be open for insertion of the flux sensor 4, 4' from the axial or the radial direction.

The magnetic core 2 can for example be made of a layered structure of laminated metal sheets. In order to achieve best mechanical stability of the gap, the partial air gap can be cut in a direction parallel to the plane of the lamination, i.e. all of the individual layers will not be fully cut then.

For application in multiphase arrangements the magnetic core 2 can be designed such that the gap can be at right angles to the other phase conductors. This may result in low crosstalk sensitivity.

The air gap can be made very thin, for example it could be designed to have a small circumferential length below 2 mm.

The flux sensor 4, 4' can be a Hall element or a magnetoresistive element or a Hall sensor integrated circuit (Hall IC). It can even be a Hall IC with high sensitivity and programmable offset.

Exemplary embodiments disclosed herein can provide the following advantages:

Reduced losses in the electronic components by a more even distribution on the dynamic range; a larger rise time of the switches is possible;

Reduced size and cost of the power transistors;

Lower ripple, for example at small and/or medium output current;

Reduced size and cost of filter components;

Smaller size of electronic components and board;

No special means is specified for heat dissipation, e.g. no molding process and heat spreader plate for cooling are necessary;

Low system cost (amplifier, output filter, power transistors, cooling);

A switched mode amplifier or Class D amplifier based on pulse width and density modulation is easier to implement due to more tolerant specifications on the drivers, MOSFETs, cooling, and output filters. This allows for a larger choice of components and lower cost for the total solution. Moreover, the low rise times allowed will simplify the printed circuit board (PCB) design and help to reduce electromagnetic emissions;

Reduced AC crosstalk sensitivity due to a more symmetric flux distribution in case there is a partial air gap;

Low offset for Hall ICs with offset compensation;

Smaller core cross sections with no gap fixation in case of a partial air gap;

Low system cost; and

A design suited for multiphase bus bar systems (with rectangular shape).

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes

FIGURE LEGEND

1 Closed loop current sensor arrangement
2 Magnetic core
3 Primary coil
4, 4' Flux sensor element
5 Air gap
6, 6' Booster circuit
7 Secondary coil
8 Terminating resistor
9 Input signal of the modulator
10 Output signal of modulator
11 Triangular wave signal at the output 15 of the differential amplifier
12, 12', 12" modulator
13 Differential amplifier circuit
14 Analog input signal of the modulator
15 Output of amplifier 13
16 Input of the Schmitt Trigger circuit
17, 17', 17", 17'" Schmitt Trigger Circuit
18, 18', 18", 18'" Output of Schmitt Trigger circuit
19 Input resistor of the integrator circuit
20 Feedback capacitor (Capacitor of the integrator circuit)
21, 21' Preamplifier
22 Highpower MOSFET
23 Highpower MOSFET
24 highside gate drive unit
25 lowside gate drive unit
26, 26' Output (lowpass) filter
27 Output of the booster circuit
28 Half bridge gate drive unit
29 Power supply filter
30 Clamping diode
31 Clamping diode
32 resistor
33 Resistor
34 Inverting buffer amplifier
35 Inverting buffer amplifier

What is claimed is:

1. A current sensor, comprising:
 a primary coil, through which current to be measured flows, creating a first magnetic field;
 a secondary coil, through which a compensation current flows, generating a magnetic field compensating the first magnetic field of the primary coil;
 a gapped magnetic core, magnetically coupled to the two primary and secondary coils and concentrating the resulting magnetic field in its air gap;
 a terminating resistor connected in series with the secondary coil;
 sensor means located in the air gap and exposed to the resulting magnetic field of the primary and secondary coils; and
 a booster circuit connected downstream of the sensor means and feeds the compensation current to the secondary coil via the terminating resistor,
 wherein the booster circuit includes a switched mode amplifier with a pulse width and density modulator that generates a pulse width and density modulated voltage signal which drives the compensation current through the secondary coil winding, and wherein the switching frequency of the modulator is a function of the compensation current such that the switching frequency is high at small currents and low at high currents.

2. The current sensor according to claim 1, wherein the pulse width and density modulator includes a differential amplifier circuit having a noninverting input that receives an analog current signal and an output connected to an input of a SchmittTrigger circuit, and wherein an output of said SchmittTrigger circuit and an inverting input of the differential amplifier are connected by a feedback loop with an ohmic resistor, and an output and the inverting input of the differential amplifier are connected by a feedback loop with a capacitor.

3. The current sensor according to claim 1, wherein the pulse width and density modulator includes a differential amplifier circuit, having a noninverting input that receives the analog current signal and an output is connected to an arrangement with two inverting buffer amplifiers, wherein the output and an inverting input of the differential amplifier are connected by a feedback loop with a capacitor, and wherein an output of said arrangement with the two inverting buffer amplifiers and the inverting input of the differential amplifier are connected by a feedback loop with an ohmic resistor to establish a negative overall feedback.

4. The current sensor according to claim 1, wherein the booster circuit includes a preamplifier, followed by the pulse width and density modulator, followed by a power stage with a FET halfbridge.

5. The current sensor according to claim 4, wherein the power stage includes a half-bridge gate driver and an output filter, connected in parallel with with two series-connected clamping diodes.

6. The current sensor according to claim 4, wherein the FET halfbridge includes two n-type MOSFETs.

7. The current sensor according to claim 1, wherein the sensor means is a Hall sensor.

8. The current sensor according to claim 1, wherein the sensor means is a magneto-resistive sensor.

9. The current sensor according to claim 7, wherein the sensor means includes is a Hall integrated circuit that having means for offset and temperature compensation.

10. The current sensor according to claim 1, wherein a bandwidth of the sensor means is limited by a filter for producing better control of a transition frequency from active to passive sensor operation mode.

11. A current sensor, comprising:
 a primary coil generating a first magnetic field based on a first current;
 a secondary coil generating a second magnetic field based on a second current;
 a magnetic core having an air gap and magnetically coupled to the primary and secondary coils;
 a sensor located in an air gap of the magnetic core; and
 a booster circuit connected downstream of the sensor and feeding the second current to the secondary coil,
 wherein the booster circuit includes a switched mode amplifier with a pulse width and density modulator that generates a pulse width and density modulated voltage signal which drives the second current through the secondary coil winding, and wherein the switching frequency of the modulator is a function of the second current.

12. The current sensor according to claim 11, wherein the second magnetic field of the secondary coil compensates the first magnetic field of the primary coil.

13. The current sensor according to claim 12, wherein the second current of the secondary coil is a compensation current.

14. The current sensor according to claim 11, wherein a magnetic field resulting from the primary and secondary coils is concentrated in the air gap of the magnetic core.

15. The current sensor according to claim 14, wherein the sensor is exposed to the resulting magnetic field of the primary and secondary coils in the air gap of the magnetic core.

16. The current sensor according to claim 11, comprising:
a terminating resistor connected in series to the secondary coil.

17. The current sensor according to claim 16, wherein the booster circuit feeds the compensation current to the secondary coil via the terminating resistor.

18. The current sensor according to claim 11, wherein the switching frequency of the switched mode amplifier is high at small currents and low at high currents.

19. The current sensor according to claim 11, wherein the pulse width and density modulator includes a differential amplifier circuit having a noninverting input that receives an analog current signal and an output connected to an input of a SchmittTrigger circuit, and wherein an output of said SchmittTrigger circuit and an inverting input of the differential amplifier are connected by a feedback loop with an ohmic resistor, and an output and the inverting input of the differential amplifier are connected by a feedback loop with a capacitor.

20. The current sensor according to claim 11, wherein the pulse width and density modulator includes a differential amplifier circuit, having a noninverting input that receives the analog current signal and an output is connected to an arrangement with two inverting buffer amplifiers, wherein the output and an inverting input of the differential amplifier are connected by a feedback loop with a capacitor, and wherein an output of said arrangement with the two inverting buffer amplifiers and the inverting input of the differential amplifier are connected by a feedback loop with an ohmic resistor to establish a negative overall feedback.

* * * * *